US010162014B2

(12) United States Patent
Iida et al.

(10) Patent No.: US 10,162,014 B2
(45) Date of Patent: Dec. 25, 2018

(54) BATTERY STATE DETERMINING DEVICE

(71) Applicant: Panasonic Intellectual Property Management Co., Ltd., Osaka (JP)

(72) Inventors: Takuma Iida, Kanagawa (JP); Hiroyuki Jimbo, Aichi (JP); Kazuhiro Sugie, Shizuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 49 days.

(21) Appl. No.: 15/321,480

(22) PCT Filed: Apr. 13, 2015

(86) PCT No.: PCT/JP2015/002051
§ 371 (c)(1),
(2) Date: Dec. 22, 2016

(87) PCT Pub. No.: WO2016/002115
PCT Pub. Date: Jan. 7, 2016

(65) Prior Publication Data
US 2017/0160349 A1 Jun. 8, 2017

(30) Foreign Application Priority Data
Jul. 2, 2014 (JP) .................. 2014-137128

(51) Int. Cl.
*G01R 31/36* (2006.01)
*H01M 10/48* (2006.01)
*H02J 7/00* (2006.01)

(52) U.S. Cl.
CPC ......... *G01R 31/3679* (2013.01); *G01R 31/36* (2013.01); *G01R 31/3648* (2013.01);
(Continued)

(58) Field of Classification Search
CPC ............ G01R 31/3648; G01R 31/3662; G01R 31/3682; G01R 31/3679
See application file for complete search history.

(56) References Cited

U.S. PATENT DOCUMENTS

2011/0112782 A1* 5/2011 Majima ................ G01R 31/361
702/63

FOREIGN PATENT DOCUMENTS

JP 2006-098135 A 4/2006
JP 2012-185122 A 9/2012
(Continued)

OTHER PUBLICATIONS

Extended European Search Report issued in Patent Application Application No. EP 15 814 234.9. dated Jul. 11, 2017.
(Continued)

Primary Examiner — Bryan Bui
(74) Attorney, Agent, or Firm — Pearne & Gordon LLP

(57) ABSTRACT

A battery state determining device includes a voltage measuring part, a remaining capacity estimating part, an internal resistance measuring part, a calculating part, and an estimating part. The voltage measuring part measures an open-circuit voltage of a storage battery. Based on the measured open-circuit voltage, the remaining capacity estimating part estimates a remaining capacity of the storage battery. The internal resistance measuring part measures an internal resistance in the storage battery. Based on the measured internal resistance, the calculating part calculates a degradation rate of the internal resistance. Based on the estimated remaining capacity and the calculated degradation rate of the internal resistance, the estimating part performs first estimation on a degradation state of the storage battery.

9 Claims, 5 Drawing Sheets

(52) U.S. Cl.
CPC ..... *G01R 31/3662* (2013.01); *G01R 31/3682* (2013.01); *H01M 10/48* (2013.01); *H02J 7/00* (2013.01)

(56) References Cited

FOREIGN PATENT DOCUMENTS

JP    2014-011060 A    1/2014
WO    2014/027389 A1   2/2014

OTHER PUBLICATIONS

International Search Report of PCT application No. PCT/JP2015/002051 dated Jun. 30, 2015.

\* cited by examiner

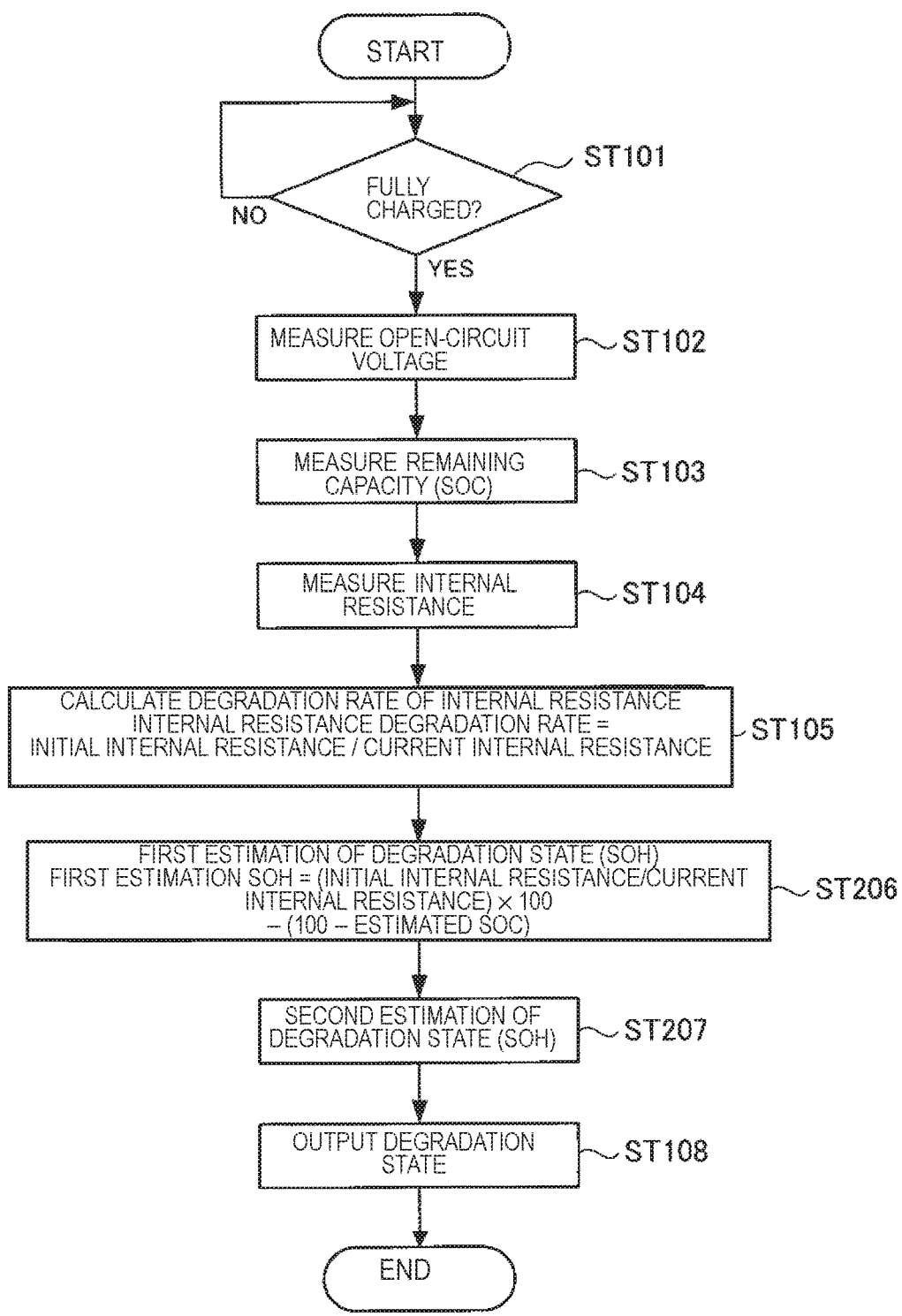

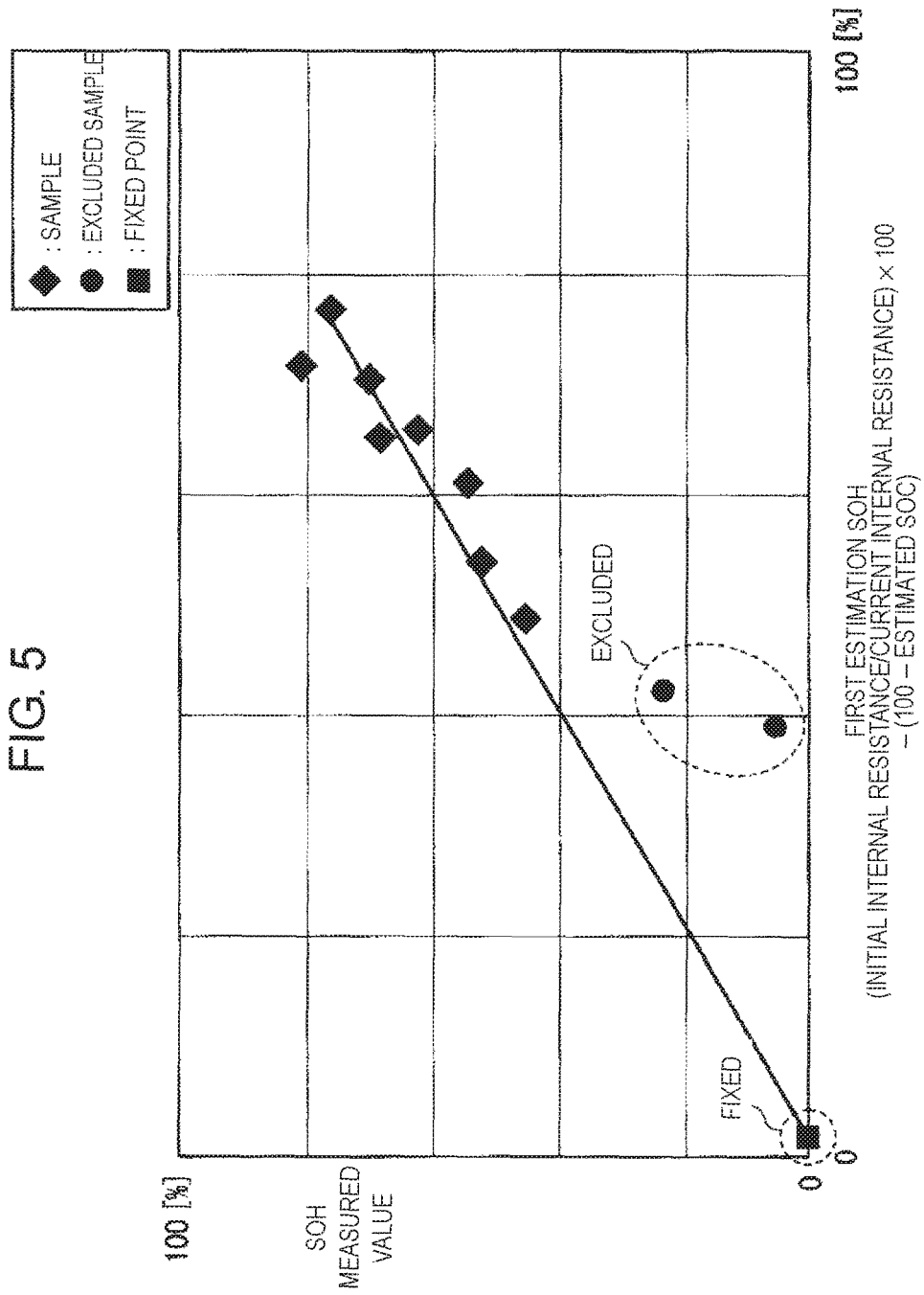

BATTERY STATE DETERMINING DEVICE

TECHNICAL FIELD

The present invention relates to a battery state determining device that determines a degradation state of a storage battery.

BACKGROUND ART

Conventionally, a device that calculates a degradation state (State of Health, or SOH) in a storage battery, and, based on the calculated degradation state, determining whether the storage battery is normal or abnormal has been proposed (see PTL 1).

The device disclosed in PTL 1 stores a history of internal resistance values, degrees of charge, and temperatures in the storage battery, and, based on the history and the internal resistance values, calculates a degradation state of the storage battery.

CITATION LIST

Patent Literature

PTL 1: Unexamined Japanese Patent Publication No. 2012-185122

SUMMARY OF THE INVENTION

The present invention provides a battery state determining device capable of estimating, at higher accuracy, a degradation state of a storage battery in which two types of degradation modes are present.

A battery state determining device according to a first aspect of the present invention includes a voltage measuring part, a remaining capacity estimating part, an internal resistance measuring part, a calculating part, and an estimating part. The voltage measuring part measures an open-circuit voltage of a storage battery. Based on the measured open-circuit voltage, the remaining capacity estimating part estimates a remaining capacity of the storage battery. The internal resistance measuring part measures an internal resistance in the storage battery. Based on the measured internal resistance, the calculating part calculates a degradation rate of the internal resistance. Based on the estimated remaining capacity and the calculated degradation rate of the internal resistance, the estimating part performs first estimation on a degradation state of the storage battery.

According to the present invention, a degradation state of a storage battery can be estimated at higher accuracy.

BRIEF DESCRIPTION OF DRAWINGS

FIG. 4 is a flowchart illustrating a process of a battery state determining device according to a second exemplary embodiment of the present invention.

FIG. 5 is a graph illustrating a data table for the battery state determining device according to the second exemplary embodiment of the present invention.

DESCRIPTION OF EMBODIMENTS

Prior to describing exemplary embodiments of the present invention, problems in a conventional battery state determining device will now briefly be described. A storage battery such as lead battery degrades due to two different reasons. That is, degradation due to a corroded collector, and degradation due to sulfation. In a corroded collector, an internal resistance is increased while an output is decreased. Sulfation causes an Open-Circuit Voltage (OCV) to decrease, thus causing a State of Charge (SOC, or a remaining capacity) to decrease.

A conventional method for calculating a degradation state does not support such two kinds of degradation, thus, for example, accuracy of a degradation state is decreased if a storage battery degrades due to sulfation, for example.

Figure 1:
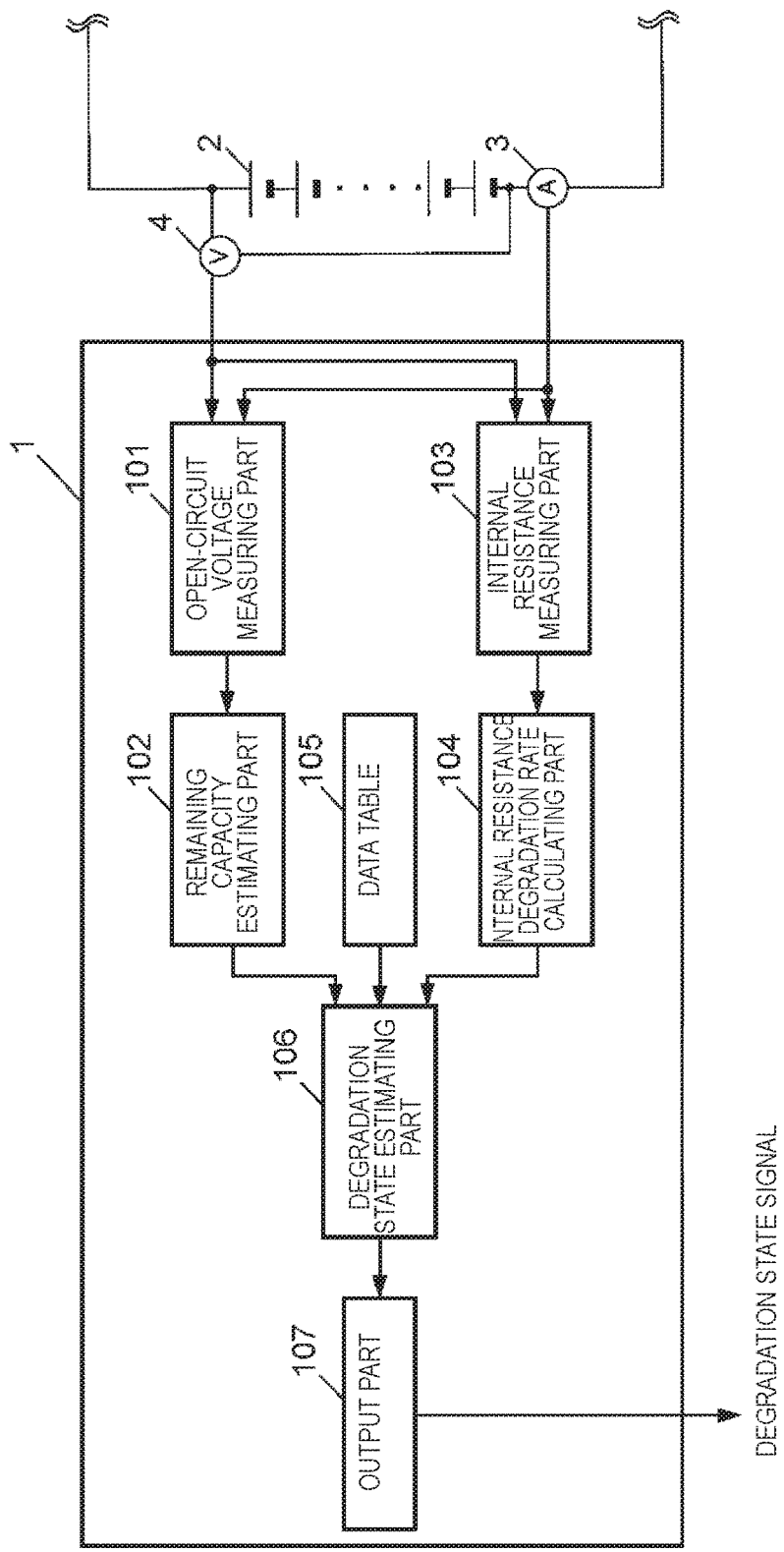
FIG. 1 is a block diagram of a battery state determining device according to a first exemplary embodiment of the present invention.

The exemplary embodiments of the present invention will now be described in detail with reference to the drawings.
First Exemplary Embodiment FIG. 1 is a block diagram of battery state determining device 1 according to a first exemplary embodiment of the present invention.

Battery state determining device 1 according to the first exemplary embodiment monitors a state of lead battery 2 mounted in a vehicle or the like, and determines a degradation state. Battery state determining device 1 is input with measurement signals sent from voltage sensor 4 that measures a voltage of lead battery 2 and current sensor 3 that measures a current flowing in lead battery 2.

Battery state determining device 1 includes open-circuit voltage measuring part 101, remaining capacity estimating part 102, internal resistance measuring part 103, internal resistance degradation rate calculating part 104, data table 105, degradation state estimating part 106, and output part 107.

Open-circuit voltage measuring part 101 measures an Open-Circuit Voltage (OCV) of lead battery 2. For example, based on the measured value of a current and a measured value of a voltage of lead battery 2, open-circuit voltage measuring part 101 measures a voltage when a current is zero as an open-circuit voltage.

Based on the measured open-circuit voltage, remaining capacity estimating part 102 estimates a remaining capacity (State of Charge, or SOC) in lead battery 2. When lead battery 2 is fully charged, remaining capacity estimating part 102 estimates that the open-circuit voltage and the remaining capacity are in inverse proportion. Remaining capacity estimating part 102 estimates a remaining capacity by applying an open-circuit voltage of when lead battery 2 is fully charged to an inverse proportion function or table data. Note that, a remaining capacity as referred to herein means a remaining capacity affected by a change in specific gravity of an electrolyte due to sulfation and degradation.

Internal resistance measuring part 103 measures an internal resistance in lead battery 2. An internal resistance may be an alternating current internal resistance or a direct current internal resistance. Internal resistance measuring part 103 measures an internal resistance by using, for example, a measured value of a current and a measured value of a voltage of lead battery 2.

Internal resistance degradation rate calculating part 104 stores an initial internal resistance in lead battery 2 to calculate a ratio between the initial internal resistance and a present internal resistance, as a degradation rate.

Based on the estimated remaining capacity, the calculated degradation rate of the internal resistance, and information of data table 105, degradation state estimating part 106 estimates a degradation state (State of Health, or SOH) in lead battery 2. Although details will be described later, degradation state estimating part 106 first performs first estimation through calculation based on the estimated remaining capacity and the calculated degradation rate of the internal resistance. Then, degradation state estimating part 106 converts a result of the calculated first estimation by using data table 105 to perform further accurate second estimation.

Data table 105 stores regression analysis data representing a distribution of first estimation values with regard to actual measured degradation states in a plurality of sample storage batteries. The regression analysis data will be described in detail later with reference to the drawings.

Output part 107 outputs a degradation state estimated by degradation state estimating part 106 to, for example, a device including a storage battery control circuit and a display part.

[Estimation on Degradation State]

Next, a method for estimating a degradation state, which is performed by degradation state estimating part 106, will now be described.

Figure 2:
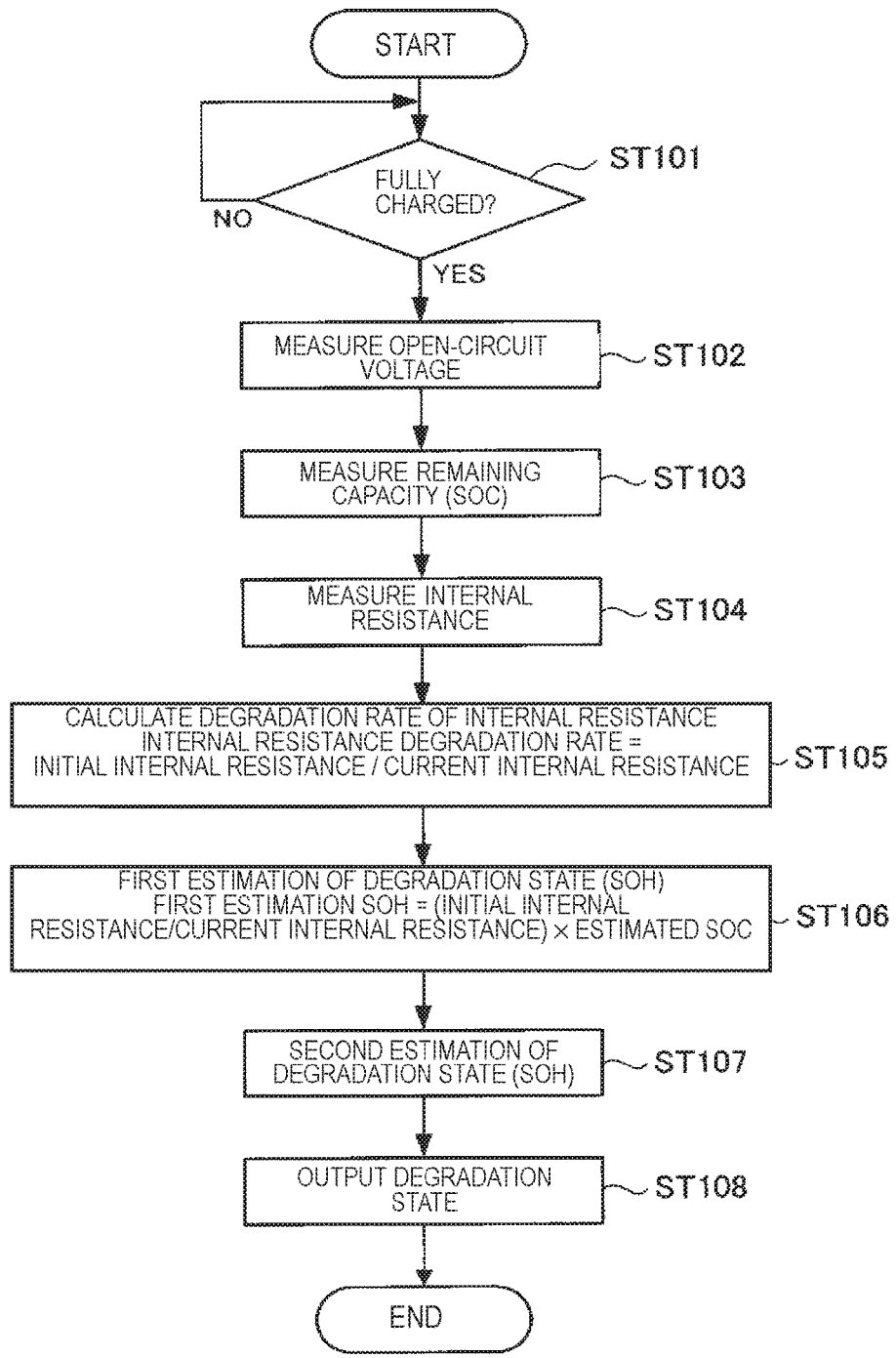
FIG. 2 is a flowchart illustrating a process of the battery state determining device according to the first exemplary embodiment of the present invention.

FIG. 2 is a flowchart illustrating a process of the battery state determining device according to the first exemplary embodiment.

Steps ST102 to ST105 are processes, which have been described above, each performed by open-circuit voltage measuring part 101, remaining capacity estimating part 102, internal resistance measuring part 103, and internal resistance degradation rate calculating part 104, and thus are omitted. By a process for waiting a timing of step S101, measurements in steps ST102, ST104 will be performed when lead battery 2 is fully charged.

In step ST106, degradation state estimating part 106 performs first estimation on a degradation state by the following equation (1).

[Formula 1]

$$\text{First estimation } SOH = (\text{Initial internal resistance/Current internal resistance}) \times \text{Estimated } SOC \quad (1)$$

Here, "Initial internal resistance/Current internal resistance" is a degradation rate of an internal resistance calculated by internal resistance degradation rate calculating part 104. The estimated SOC is a remaining capacity [%] estimated by remaining capacity estimating part 102. For example, first estimation on a degradation state of a storage battery may be performed when a calculated degradation rate of an internal resistance is equal to or above a predetermined value. In addition, output part 107 may output a notification for exchanging the storage battery when the calculated degradation rate of the internal resistance is below the predetermined value.

As described above, highly accurate estimation can be performed by using a value obtained by multiplying a degradation rate of an internal resistance and a remaining capacity (SOC) estimated from an open-circuit voltage, for estimating a degradation state (SOH) in lead battery 2.

In step S107, degradation state estimating part 106 uses first estimation SOH and regression analysis data in data table 105 for conversion to perform second estimation on the degradation state.

Figure 3:
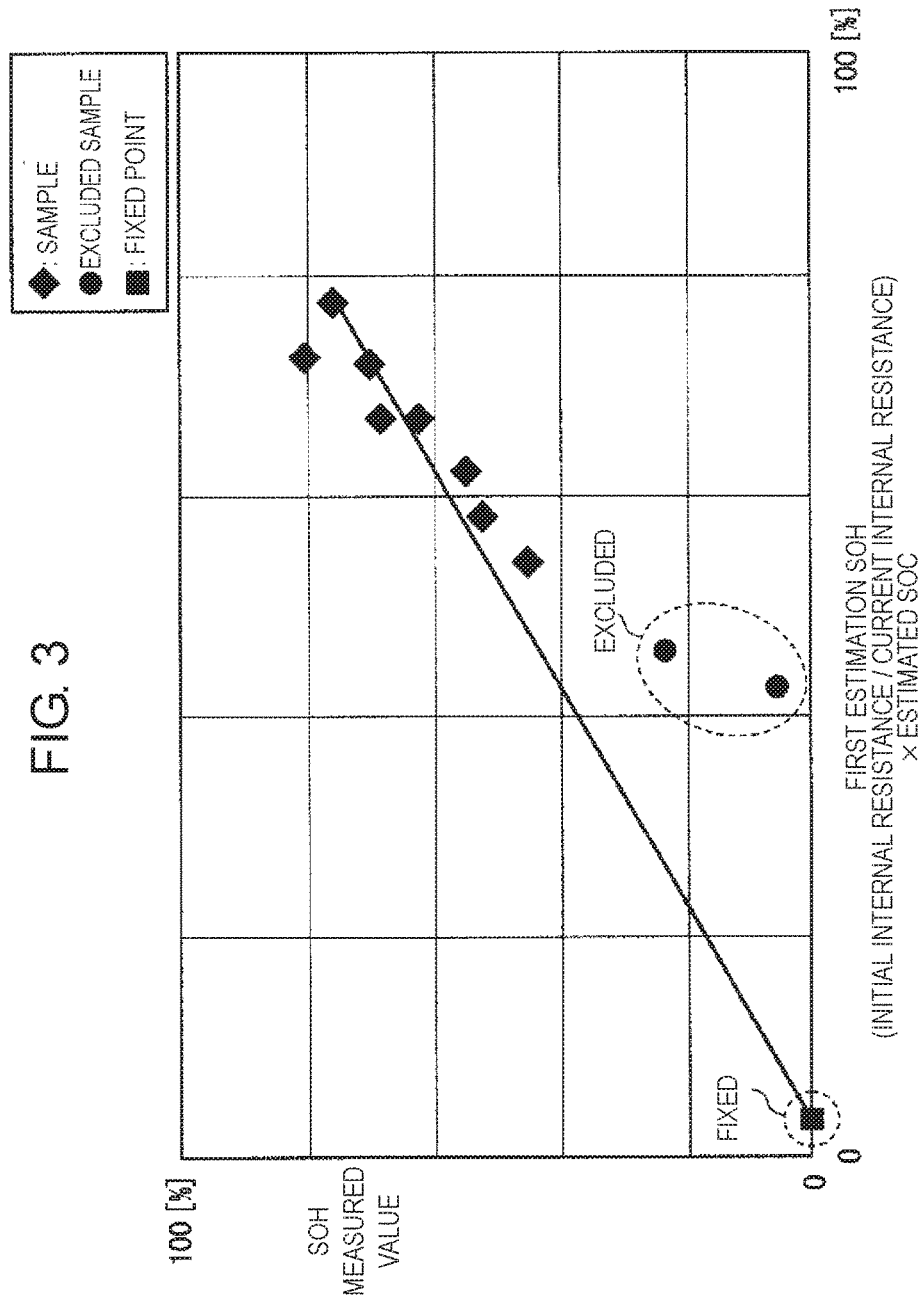
FIG. 3 is a graph illustrating a data table for the battery state determining device according to the first exemplary embodiment of the present invention.

FIG. 3 is a graph illustrating regression analysis data in a data table.

The regression analysis data in data table 105 is obtained in advance and stored in data table 105. The regression analysis data is data of a regression line obtained from measured values of actual degradation states (SOH) and results of the first estimations with regard to a plurality of samples, so that a correlation between an actual measured value and a first estimation value becomes higher. A regression line may be obtained by using, for example, a least squares method or another similar method.

For the plurality of samples, it is preferable that samples with a measured value of a degradation state of 40% or smaller, for example, are excluded. Because, when the degradation state is 40% or smaller, regularity in a relationship between a degradation rate of an internal resistance, a remaining capacity (SOC) estimated from an open-circuit voltage, and an actual degradation state (SOH) becomes smaller.

Furthermore, it is preferable that regression analysis data is obtained by setting, as a fixed point, at least a point in a range where measured values are equal to or below 40%, so that a first estimation value is at point zero when a measured value of a degradation state (SOH) is at point zero. Note that the fixed point may not necessarily coincide with point zero, but may differ from point zero, as shown in FIG. 3.

For second estimation, regression analysis data like a line shown in FIG. 3 is used to apply a first estimation value for a degradation state onto a horizontal axis shown in FIG. 3 to set, as a second estimation value for the degradation state, a value on a vertical axis for regression analysis data, which corresponds to the value on this horizontal axis. Note that, in the actual estimation process, a graph may not necessarily be used, but a function or a data table may be used to obtain a second estimation value from a first estimation value.

Through a process for second estimation, a highly accurate degradation state (SOH) can be estimated in accordance with an actual measured value.

ST108 is a process of output part 107 described above.

As described above, with battery state determining device 1 according to the first exemplary embodiment, a highly accurate degradation state (SOH) can be estimated for lead battery 2 that degrades due to two different kinds of degradation, i.e., degradation due to a corroded collector and degradation due to sulfation.

This estimation method is particularly advantageous because a highly accurate degradation state (SOH) can be estimated for, in addition to normal vehicular lead batteries, lead batteries in which loads rapidly fluctuate, such as lead batteries for vehicles with an idle stop function in which a battery is charged and discharged repeatedly.

Second Exemplary Embodiment

FIG. 4 is a flowchart illustrating a process of a battery state determining device according to a second exemplary embodiment. FIG. 5 is a graph illustrating regression analysis data stored in a data table according to the second exemplary embodiment.

The second exemplary embodiment is identical to the first exemplary embodiment except that a calculation formula used in degradation state estimating part 106 is changed, and along with this change of the calculation formula, regression analysis data in data table 105 is changed. Similar configurations and steps are applied with identical reference marks, and descriptions thereof are omitted.

In step ST206 shown in FIG. 4, degradation state estimating part 106 performs first estimation on a degradation state by the following equation (2).

[Formula 2]

$$\text{First estimation } SOH=(\text{Initial internal resistance/Current internal resistance})\times 100-(100-\text{Estimated } SOC) \quad (2)$$

As described above, by using a value obtained by adding a degradation rate of an internal resistance and a remaining capacity (SOC) estimated from an open-circuit voltage, for estimating a degradation state (SOH), highly accurate estimation can be performed. Here, "×100" is a coefficient for unifying the units, while "100−Estimated SOC" represents a conversion from a remaining capacity into an amount of reduction in capacity.

In step S207, degradation state estimating part 106 uses first estimation SOH and regression analysis data in data table 105 for conversion to perform second estimation on the degradation state.

As shown in FIG. 5, the regression analysis data in data table 105 uses, as first estimation values for a plurality of samples, a regression line that is regression-analyzed based on values obtained through the equation (2).

For the plurality of samples, it is preferable that samples with a measured value of a degradation state of 40% or smaller, for example, are excluded. Furthermore, it is preferable that regression analysis data is obtained by setting, as a fixed point, at least a point in a range where measured values are equal to or below 40%, so that a first estimation value is at point zero when a measured value of a degradation state (SOH) is at point zero. Note that, output part 107 may output a notification for exchanging a storage battery when a degradation state as a result of the second estimation is below 40%.

Through a process for second estimation, a highly accurate degradation state (SOH) can be estimated in accordance with an actual measured value.

As described above, with the battery state determining device according to the second exemplary embodiment, a highly accurate degradation state (SOH) can be estimated for lead battery 2 that degrades due to two different kinds of degradation, i.e., degradation due to a corroded collector and degradation due to sulfation.

The exemplary embodiments of the present invention have been described above. Although estimation of a degradation state (SOH) in a lead battery has been described in the above exemplary embodiments, a similar effect can be achieved for storage batteries that degrade due to at least two different kinds of degradation.

In addition, the formula for performing first estimation on a degradation state can be modified into equations (3) to (5) as shown below.

[Formula 3]

$$\text{First estimation } SOH=g1\times\{(\text{Internal resistance degradation rate}\times 100)-(100-\text{Estimated } SOC)\}+g2\times(\text{Internal resistance degradation rate}\times\text{Estimated } SOC) \quad (3)$$

Here, g1 and g2 are weighting coefficients.

As described above, it is preferable that degradation state estimating part 106 uses a value obtained by multiplying an estimated remaining capacity (SOC) and a calculated degradation rate of an internal resistance, and a value obtained by adding the SOC and the calculated degradation rate of the internal resistance to estimate a degradation state of lead battery 2.

[Formula 4]

$$\text{First estimation } SOH=\alpha 1\times(\text{Internal resistance degradation rate}\times 100)-\alpha 2(100-\text{Estimated } SOC) \quad (4)$$

Here, α1 and α2 are weighting coefficients that are not 0.

[Formula 5]

$$\text{First estimation } SOH=\beta 1\times\text{Internal resistance degradation rate}\times\text{Estimated } SOC+\beta 2 \quad (5)$$

Here, β1 and β2 are coefficients.

Coefficients g1, g2, α1, α2, β1, and β2 can be adjusted as necessary in association with a storage battery through experiments and the like. Furthermore, another correction formula, such as temperature correction, may be added for first estimation SOH.

In addition, although line-fitted data has been illustrated as regression analysis data in the above exemplary embodiments, curve-fitted, curved data may also be adopted.

In addition, although configurations in which first estimation and second estimation are performed for a degradation state have been illustrated in the above exemplary embodiments, the second estimation may be omitted. Even in this case, estimation can be performed with higher accuracy than the conventional estimation.

In addition, although above exemplary embodiments have been described by taking as an example a case where the present invention is configured with hardware, the present invention can be achieved with software through a cooperation with hardware.

INDUSTRIAL APPLICABILITY

The present invention can be applied to a device that determines a degradation state of a storage battery.

What is claimed is:

1. A battery state determining device comprising:
a voltage measuring part that measures an open-circuit voltage of a storage battery;
a remaining capacity estimating part that estimates, based on the measured open-circuit voltage, a remaining capacity of the storage battery;
an internal resistance measuring part that measures an internal resistance in the storage battery;
a calculating part that calculates, based on the measured internal resistance, a degradation rate of the internal resistance;
an estimating part that performs, based on the estimated remaining capacity and the calculated degradation rate of the internal resistance, first estimation on a degradation state of the storage battery; and
an output part that outputs a notification for exchanging the storage battery when the calculated degradation rate of the internal resistance is below a predetermined value,
wherein the estimating part performs the first estimation on the degradation state of the storage battery when the calculated degradation rate of the internal resistance is equal to or above the predetermined value.

2. The battery state determining device according to claim 1, wherein the estimating part uses a value obtained by multiplying the estimated remaining capacity and the calculated degradation rate of the internal resistance to estimate a degradation state of the storage battery.

3. The battery state determining device according to claim 1, wherein the estimating part uses a value obtained by adding the estimated remaining capacity and the calculated degradation rate of the internal resistance to estimate a degradation state of the storage battery.

4. The battery state determining device according to claim 1, wherein the estimating part uses a value obtained by multiplying the estimated remaining capacity and the calculated degradation rate of the internal resistance, and a value obtained by adding the estimated remaining capacity and the calculated degradation rate of the internal resistance to estimate a degradation state of the storage battery.

5. A battery state determining device comprising:
a voltage measuring part that measures an open-circuit voltage of a storage battery;
a remaining capacity estimating part that estimates, based on the measured open-circuit voltage, a remaining capacity of the storage battery;
an internal resistance measuring part that measures an internal resistance in the storage battery;
a calculating part that calculates, based on the measured internal resistance, a degradation rate of the internal resistance;
an estimating part that performs, based on the estimated remaining capacity and the calculated degradation rate of the internal resistance, first estimation on a degradation state of the storage battery; and
a data table that stores regression analysis data representing a distribution tendency of the estimated degradation states with regard to measured degradation states in a plurality of sample storage batteries,
wherein the estimating part performs, based on a result of the first estimation and the regression analysis data, second estimation on a degradation state of the storage battery.

6. The battery state determining device according to claim 5, wherein the regression analysis data is data obtained by excluding samples in which the measured degradation state is below 40%.

7. The battery state determining device according to claim 6, further comprising an output part that outputs a notification for exchanging the storage battery when a degradation state according to the second estimation is below 40%.

8. The battery state determining device according to claim 5, wherein the regression analysis data is data obtained by setting a value of the estimated degradation state corresponding to at least a value of the measured degradation state that is below 40% as a fixed value that differs from a value estimated by the estimating part.

9. The battery state determining device according to claim 8, further comprising an output part that outputs a notification for exchanging the storage battery when a degradation state according to the second estimation is below 40%.

* * * * *